United States Patent

Ruitenburg

[11] Patent Number: 5,978,049
[45] Date of Patent: Nov. 2, 1999

[54] CIRCUIT ARRANGEMENT FOR SUPPLYING AN ANTENNA SIGNAL

[75] Inventor: Leo Ruitenburg, Swalmen, Netherlands

[73] Assignee: U.S. Philips Corporation, New York, N.Y.

[21] Appl. No.: 08/729,481

[22] Filed: Oct. 10, 1996

Related U.S. Application Data

[63] Continuation-in-part of application No. 08/426,292, Apr. 20, 1995, Pat. No. 5,706,060.

[30] Foreign Application Priority Data

Oct. 13, 1995 [DE] Germany .......................... 195 38 172

[51] Int. Cl.$^6$ ....................................................... H04N 5/44
[52] U.S. Cl. ........................................... 348/725; 348/705
[58] Field of Search .................................. 348/725, 726, 348/705; 455/78, 82, 83, 140, 281; 333/101, 103, 104, 262; 327/493, 504; 307/125, 130

[56] References Cited

U.S. PATENT DOCUMENTS 5,706,060  1/1998  Ruitenburg .............................. 348/725

FOREIGN PATENT DOCUMENTS 0679025  10/1995  European Pat. Off. .
952009629  10/1995  European Pat. Off. .

Primary Examiner—Andrew I. Faile
Assistant Examiner—Uyen Le
Attorney, Agent, or Firm—Edward W. Goodman

[57] ABSTRACT

A circuit arrangement, for supplying an antenna signal to a receiver arrangement of a video recorder and/or to a television receiver, connected to the video recorder, includes a switching device by which, in the blocked state, the antenna signal can be applied only to the receiver arrangement of the video recorder and from this video recorder to the television receiver, and by which, in the conducting state, the antenna signal can be applied directly to the television receiver via this video recorder. To avoid unwanted low impedances at the input and the output, the switching device includes a series arrangement of, successively, a first capacitive switching element having a constant capacitance, at least one pair of second capacitive switching elements and a third capacitive switching element having a constant capacitance. Except for the first and last of the second capacitive switching elements in the series arrangement of all second capacitive switching elements, the second capacitive switching elements may be formed as capacitive diodes. It is thereby achieved that in the blocked state, a high ohmic capacitive switching element is always arranged between the input of the switching device and ground or between the output of the switching device and ground.

2 Claims, 1 Drawing Sheet

CIRCUIT ARRANGEMENT FOR SUPPLYING AN ANTENNA SIGNAL

CROSS-REFERENCE TO RELATED APPLICATIONS

This is a continuation-in-part application of U.S. patent application Ser. No. 08/426,292, filed Apr. 20, 1995, now U.S. Pat. No. 5,706,060.

BACKGROUND OF THE INVENTION

1. Field of the Invention

The invention relates to a circuit arrangement for supplying an antenna signal to a receiver arrangement of a video recorder and/or a television receiver, connected to said video recorder, said circuit arrangement comprising a switching device by which, in the blocked state, the antenna signal can be applied only to the receiver arrangement of the video recorder and from this video recorder to the television receiver, and by which, in the conducting state, the antenna signal can be applied directly to the television receiver via this video recorder. The invention also relates to a switching device which, in its blocked state, interrupts the supply of an antenna signal and, in its conducting state, allows the supply of the antenna signal.

2. Description of the Related Art

Such a circuit arrangement and a switching device therefor are described in European Patent Application 95 200 962.9, corresponding to U.S. patent application Ser. No. 08/426,292, filed Apr. 20, 1995, now U.S. Pat. No. 5,706, 060. The switching device described in this Application preferably comprises a series arrangement of at least two capacitance diodes which are alternately arranged with opposite polarities. The cathode of the first capacitance diode in this series arrangement is connected to an antenna input via a first coupling capacitor. If there is a corresponding number of capacitance diodes in the series arrangement, the anode of the last capacitance diode of the series arrangement is connected to an antenna output via a second coupling capacitor. In this case, a low-ohmic connection to ground is created in the blocked state of the switching device by the antenna output via the second coupling capacitor. This may lead to an erroneous adaptation of the characteristic impedance of a conductor arrangement connected to the antenna output.

SUMMARY OF THE INVENTION

It is an object of the invention to improve a circuit arrangement and an associated switching device of the type described in the opening paragraph in such a way that the described erroneous adaptation is obviated.

In a circuit arrangement and an associated switching device of the type described in the opening paragraph, this object is solved in that the switching device comprises a series arrangement of, successively, a first capacitive switching element having a constant capacitance, at least one pair of second capacitive switching elements and a third capacitive switching element having a constant capacitance, the second capacitive switching elements within the pairs being arranged in series, the first capacitive switching element being connected to an input for applying the antenna signal to the switching device, and the third capacitive switching element being connected to an output for supplying the antenna signal from the switching device, for changing the switching device to the blocked state, a low potential can be supplied to the connections of the second switching elements within the pairs and a high potential can be supplied to the interconnections between the pairs or to the first and the third capacitive switching element, in at least one of the pairs, at least one of the second capacitive switching elements has a constant capacitance and the other second capacitive switching elements are constituted as capacitance diodes having anodes which are connected to the connections within the pairs and cathodes which are connected to the interconnections between the pairs, one of the second capacitive switching elements constituted as capacitance diode is connected to the first and the third capacitive switching element, respectively.

The switching device according to the invention thus includes at least one pair of series-arranged capacitive switching elements. If more pairs of such switching elements are included, the single pairs are arranged in series with each other and the series arrangement thus formed is arranged at its beginning and end in series with the first and the third capacitive switching element, respectively. Except for the first and last of the second capacitive switching elements in the series arrangement of all second capacitive switching elements, the second capacitive switching elements may optionally be formed with a constant or variable capacitance, i.e., in the latter case as capacitance diodes. It is thereby achieved that in the blocked state of the switching device a capacitive switching element which is then high-ohmic is always arranged between the input of the switching device and ground or between the output of the switching device and ground. The low-ohmic termination described is thereby avoided.

These and other aspects of the invention will be apparent from and elucidated with reference to the embodiments described hereinafter.

BRIEF DESCRIPTION OF THE DRAWING

With the above objects and advantages in mind as will hereinafter occur, the invention will be described with reference to the accompanying drawing, in which.

DESCRIPTION OF THE PREFERRED EMBODIMENTS

Figure 1:
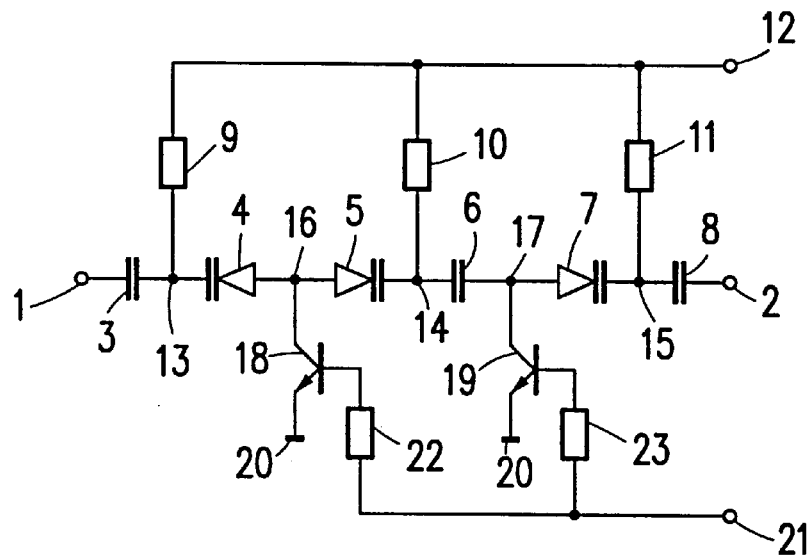
FIG. 1 shows a schematic diagram of a first embodiment of the invention.

In the first embodiment of the switching device, shown in FIG. 1, a series arrangement of a first coupling capacitor 3, a first and a second capacitance diode 4 and 5, a capacitor 6, a third capacitance diode 7 and a second coupling capacitor 8 is arranged between an input 1, which may be constituted, for example, by an antenna input of a video recorder, and an output 2, which may be constituted, for example, by an antenna output of the video recorder. The first coupling capacitor 3 constitutes the first capacitive switching element, the capacitance diodes 4, 5, 7 and the capacitor 6 constitute the second capacitive switching elements and the second coupling capacitor 8 constitutes the third capacitive switching element. Within the second capacitive switching elements, the first and second capacitance diodes 4, 5 constitute the first pair and the capacitor 6 and the third capacitance diode 7 constitute the second pair.

The connections between the first coupling capacitor 3, the first pair of second capacitive switching elements constituted by the first and second capacitance diodes 4, 5, the second pair of second capacitive switching elements constituted by the capacitor 6 and the third capacitance diode 7, and the second coupling capacitor 8 are connected to a first control terminal 12 via series resistors 9, 10, 11, respectively. These connections between the capacitive switching elements are denoted by the reference numerals 13, 14, 15 in FIG. 1. The connections of the second switching elements within the pairs—capacitance diodes 4, 5, capacitor 6 and capacitance diode 7—are denoted by the reference numerals 16 and 17 and connected to ground 20 via switching transistors 18 and 19, respectively. A second control terminal 21 is connected to the base terminal of these switching transistors 18, 19 via base resistors 22 and 23, respectively.

The control terminals 12, 21 receive switching voltages. For example, a (DC) potential of 33 V is used as a switching voltage for the first control terminal 12 in the blocked state of the switching device, whereas a potential of 5 V can be applied as a switching voltage to the second control terminal 21. However, by corresponding dimensioning of the base resistors 22, 23 and the series resistors 9, 10, 11 as well as the capacitance diodes 4, 5, 7, the capacitor 6 and the switching transistors 18, 19, other, preferably corresponding potentials may also be used. When switching voltages are present, the anodes of the capacitance diodes 4, 5, 7 are connected to ground 20, whereas the cathodes are connected to a high potential. Consequently, the capacitance diodes 4, 5, 7 have a very low capacitance so that the signal path from the input 1 to the output 2 has a high signal attenuation. Particularly the ratio between the impedances of the blocked capacitance diodes 4, 5, 7 and the impedances of the conducting switching transistors 18, 19 is significant for the achievable signal attenuation.

However, if the switching voltages, i.e., the high potentials, at the control terminals 12, 21 are switched off, the coupling to ground of the connections of the second capacitive switching elements within the pairs is interrupted. Then, a low potential is present at the connections between the single pairs of the second capacitive switching elements. If the control terminals 12, 21 are not adjusted at a low potential, but switched free from potential, potential differences tending towards zero adjust themselves between the anodes and cathodes of the capacitance diodes 4, 5, 7 (possibly by parasitic leakage resistances), so that the capacitance diodes 4, 5, 7 now assume high capacitance values. A good signal coupling from the input 1 to the output 2 is then achieved via these diodes and the capacitor 6.

Figure 2:
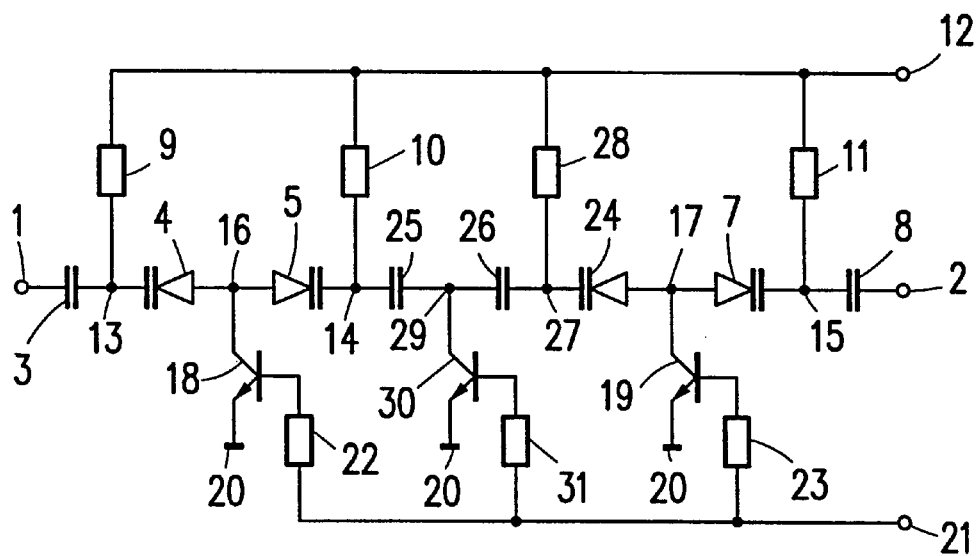
FIG. 2 shows a schematic diagram of a second embodiment of the invention.

FIG. 2 shows a further embodiment of a switching device, as used in the invention, with a signal attenuation which is larger as compared with the device shown in FIG. 1. As compared with the embodiment shown in FIG. 1, a fourth capacitance diode 24 has replaced the capacitor 6 in the second pair of second capacitive switching elements. A third pair of second capacitive switching elements is constituted by two further capacitors 25, 26, which are inserted in the series arrangement of the capacitive switching elements already described. The (second) connection 14 is now arranged between the first pair 4, 5 and the third pair 25, 26, a (fourth) connection 27 connects the third pair 25, 26 to the modified second pair 24, 7. Of this connection 27, a fourth series resistor 28 is connected to the first control terminal 12. A (third) connection 29 within the third pair 25, 26 is connected to ground 20 via a (third) switching transistor 30. The base terminal of this transistor is connected to the second control terminal 21 via a (third) base resistor 31.

As compared with the situation in FIG. 1, the third pair 25, 26 in FIG. 2 realizes an increased signal attenuation by the short-circuit to ground 20 made additionally possible via the switching transistor 30 in the blocked state of the switching device, without the use of additional capacitance diodes.

In further modifications of the embodiments of the switching device, the capacitors 25, 26 may be individually or jointly replaced by capacitance diodes. Further pairs of second capacitive switching elements may also be inserted. For frequency response compensation, corresponding matching elements constituted by, for example, inductances, capacitances and resistors may be additionally arranged at the input 1 and/or at the output 2. Particularly the capacitive transient response of the switching devices shown may at least partly be compensated by these elements.

I claim:

1. A circuit arrangement for supplying an antenna signal to a receiver arrangement of a video recorder and/or a television receiver, connected to said video recorder, which circuit arrangement comprises a switching device by which, in the blocked state, the antenna signal can be applied only to the receiver arrangement of the video recorder and from this video recorder to the television receiver, and by which, in the conducting state, the antenna signal can be applied directly to the television receiver via this video recorder, characterized in that the switching device comprises a series arrangement of, successively, a first capacitive switching element having a constant capacitance, at least one pair of second capacitive switching elements and a third capacitive switching element having a constant capacitance, the second capacitive switching elements within the pairs being arranged in series, the first capacitive switching element being connected to an input for applying the antenna signal to the switching device, and the third capacitive switching element being connected to an output for supplying the antenna signal from the switching device, a low potential, supplied to the connections of the second switching elements within the pairs and a high potential, supplied to the interconnections between the pairs or to the first and the third capacitive switching element, said low potential and said high potential for changing the switching device to the blocked state, in at least one of the pairs, at least one of the second capacitive switching elements has a constant capacitance and the other second capacitive switching elements are constituted as capacitance diodes having anodes which are connected to the connections within the pairs and cathodes which are connected to the interconnections between the pairs, one of the second capacitive switching elements constituted as capacitance diode is connected to the first and the third capacitive switching element, respectively.

2. A switching device which, in its blocked state, interrupts the supply of an antenna signal and, in its conducting state, allows the supply of the antenna signal, characterized in that the switching device comprises a series arrangement of, successively, a first capacitive switching element having a constant capacitance, at least one pair of second capacitive switching elements and a third capacitive switching element having a constant capacitance, the second capacitive switching elements within the pairs being arranged in series, the first capacitive switching element being connected to an input for applying the antenna signal to the switching device, and the third capacitive switching element being connected to an output for supplying the antenna signal from the switching device, a low potential, supplied to the connections of the second switching elements within the pairs and a high potential, supplied to the interconnections between the pairs or to the first and the third capacitive switching element, said low potential and said high potential for changing the switching device to the blocked state, in at least one of the pairs, at least one of the second capacitive switching elements has a constant capacitance and the other second capacitive switching elements are constituted as capacitance diodes having anodes which are connected to the connections within the pairs and cathodes which are connected to the interconnections between the pairs, one of the second capacitive switching elements constituted as capacitance diode is connected to the first and the third capacitive switching element, respectively.

\* \* \* \* \*